United States Patent
Schmidt et al.

(10) Patent No.: US 11,557,335 B2
(45) Date of Patent: Jan. 17, 2023

(54) ERASING A PARTITION OF AN SRAM ARRAY WITH HARDWARE SUPPORT

(71) Applicant: INTERNATIONAL BUSINESS MACHINES CORPORATION, Armonk, NY (US)

(72) Inventors: Martin Bernhard Schmidt, Stuttgart (DE); Peter Altevogt, Ettlingen (DE); Wolfgang Gellerich, Boeblingen (DE); Juergen Pille, Stuttgart (DE); Harry Barowski, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 16/922,370

(22) Filed: Jul. 7, 2020

(65) Prior Publication Data
US 2022/0013166 A1   Jan. 13, 2022

(51) Int. Cl.
*G11C 11/419*   (2006.01)
*G11C 11/418*   (2006.01)

(52) U.S. Cl.
CPC .......... *G11C 11/419* (2013.01); *G11C 11/418* (2013.01)

(58) Field of Classification Search
CPC ....... G11C 11/418; G11C 11/419; G11C 7/20; G11C 11/41; G11C 11/413
(Continued)

(56) References Cited

U.S. PATENT DOCUMENTS

RE34,445 E * 11/1993 Hayes ................... G11C 29/36
                                                           714/719
5,297,104 A   3/1994 Nakashima
(Continued)

FOREIGN PATENT DOCUMENTS

| CN | 204045210 U | 12/2014 |
|----|-------------|---------|
| CN | 106844045 A | 6/2017  |
| CN | 109992530 A | 7/2019  |

OTHER PUBLICATIONS

Disclosed Anonymously, "How to clear RAM", liutilities.com, Free Resource Libraries, URL: http://www.liutilities.com/how-to/clear-ram/, printed May 28, 20, 3 pages.
(Continued)

*Primary Examiner* — Sung Il Cho
(74) *Attorney, Agent, or Firm* — Teddi E. Maranzano (57) ABSTRACT

The disclosure relates to an initialization circuit for initializing memory cells of a memory array including a common bit line. Individual memory cells are coupled to the common bit line of the memory array via at least one pass element of the individual memory cells. The initialization circuit is operable for receiving a set of partition addresses specifying the partitions, i.e. the memory cells to be initialized. The initialization circuit is operable for successively initializing one cell of the partitions to be initialized and iteratively initializing the remaining memory cells of the partitions to be initialized. A number of memory cells initialized simultaneously in one iteration increases from one iteration to another iteration. Initializing a certain memory cell comprises activating the pass element of the cell so that the memory cell is connected to the bit line. Further aspects relate to methods for initializing memory cells and semiconductor circuits.

15 Claims, 5 Drawing Sheets

(58) Field of Classification Search
USPC .......................................................... 365/156
See application file for complete search history.

(56) References Cited

U.S. PATENT DOCUMENTS

| | | |
|---|---|---|
| 5,517,451 A | 5/1996 | Okuzawa |
| 5,652,730 A | 7/1997 | Kono |
| 5,909,390 A | 6/1999 | Harari |
| 6,519,177 B1 | 2/2003 | Brown |
| 7,161,842 B2 | 1/2007 | Park |
| 7,804,718 B2 | 9/2010 | Kim |
| 7,821,831 B2 | 10/2010 | Lovett |
| 3,320,190 A1 | 11/2012 | Wingyu |
| 8,588,024 B2 | 11/2013 | Patel et al. |
| 9,263,111 B2 | 2/2016 | Ha |
| 9,558,808 B2 | 1/2017 | Parris |
| 9,679,632 B2 | 6/2017 | Mohammad et al. |
| 9,864,544 B2 | 1/2018 | Oh et al. |
| 9,952,802 B2 | 4/2018 | Salah et al. |
| 10,585,619 B1 | 3/2020 | Schmidt et al. |
| 10,748,590 B2 | 8/2020 | Koo |
| 10,901,651 B2 | 1/2021 | Schmidt |
| 2011/0032775 A1 | 2/2011 | Lovett |
| 2012/0230143 A1 | 9/2012 | Patel |
| 2013/0148442 A1* | 6/2013 | Ijitsu .................... G11C 7/1069 365/189.011 |
| 2015/0170748 A1 | 6/2015 | Costa et al. |
| 2016/0293244 A1 | 10/2016 | Mohammad et al. |
| 2019/0392179 A1 | 12/2019 | Lu |
| 2020/0159440 A1 | 5/2020 | Schmidt et al. |

OTHER PUBLICATIONS

IBM: List of IBM Patents or Patent Applications Treated as Related (Appendix P), Jul. 7, 2020, pp. 1-2.
Pending U.S. Appl. No. 16/922,428, filed Jul. 7, 2020, entitled: "Erasing Large Blocks of Charge-Based Memory With Hardware Support", pp. 1-18.
IBM: List of IBM Patents or Patent Applications Treated as Related (Appendix P), Nov. 2, 2021, 2 pages.
Pending U.S. Appl. No. 16/922,428, entitled "Semiconductor Circuit Including an Initialization Circuit for Initializing Memory Cells and Clearing of Relatively Large Blocks of Memory", filed Jul. 7, 2020, 18 Pages.

* cited by examiner

Fig. 1

Prior Art

Fig. 2

Prior Art

ERASING A PARTITION OF AN SRAM ARRAY WITH HARDWARE SUPPORT

BACKGROUND

The disclosure relates to computer memory. More specifically, the disclosure relates to the initialization of memory blocks in computer memory.

Computer memory may be organized in a hierarchy, from processor registers, over multiple cache levels, to external main memory. The highest or uppermost cache level is the one closest to the processor, and the lowest cache level is the one closest to the main memory. Access latency is lowest, and bandwidth is highest, for registers and upper cache levels. For example, a data word in core static random access memory (SRAM) or core dynamic random access memory (DRAM) may be accessed in 1 (one) clock cycle. For the cache, accessing a data word may require two to tens of cycles, and for the main memory, up to hundreds of cycles.

Memory block initialization, e.g., clearing of relatively large blocks of memory so that each cell in the block of memory holds the same value (e.g., all cells hold '0' or all cells hold '1') after the initialization is completed, may be performed relatively frequently in a computer system, and may affect overall system performance.

SUMMARY

Aspects of the disclosure relate to an initialization circuit for initializing memory cells of a memory array. The memory array includes a common bit line. The individual memory cells are coupled to the common bit line of the memory array via at least one pass element of the individual memory cells. The initialization circuit receives a set of partition addresses. The set of partition addresses specifies the partitions, the memory cells which are to be initialized. Furthermore, the initialization circuit successively initializing one cell of the partitions to be initialized and iteratively initializes the remaining memory cells of the partitions to be initialized. A number of memory cells initialized simultaneously in one iteration increases from one iteration to another iteration. Initializing a certain memory cell comprises activating the pass element of the cell so that the memory cell is connected to the bit line.

Further, aspects of the disclosure relate to a method for initializing memory cells of a memory array. The method comprises providing a set of partition addresses, wherein the set of partition addresses specifies the partitions, the memory cells of which are to be initialized. In addition, the method prescribes successively initializing one cell of the partitions to be initialized. Moreover, the method includes iteratively initializing the remaining memory cells of the partitions to be initialized, wherein a number of memory cells initialized simultaneously in one iteration increases from one iteration to another iteration and initializing a certain memory cell comprises activating the pass element of that cell so that the memory cell is connected to a bit line.

Other aspects of the disclosure relate to a semiconductor circuit comprising a memory array and an initializing circuit.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

DETAILED DESCRIPTION

Figure 1:
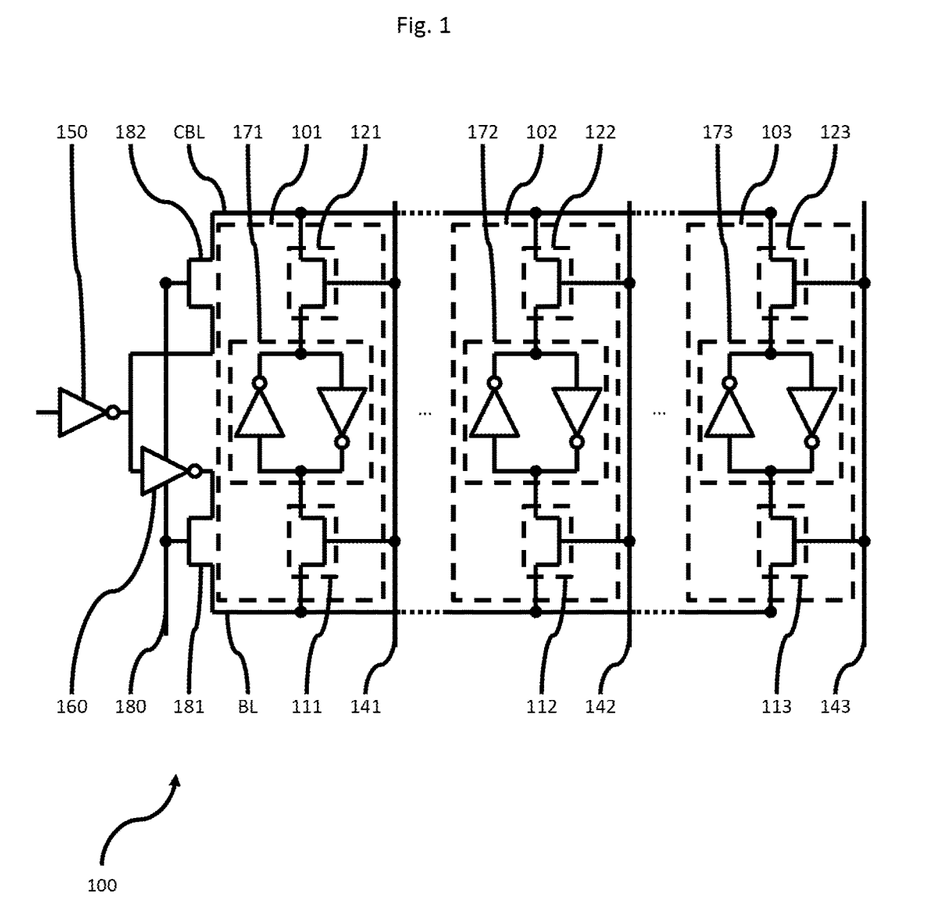
FIG. 1 shows a memory array.

FIG. 1 shows memory cells 101, 102, 103 of a memory array 100. The memory array 100 includes a common bit line BL and a complementary bit line CBL. The individual memory cells 101, 102, 103 are coupled to the common bit line BL via respective pass elements 111, 112, 113 and to the complementary bit line CBL via respective pass elements 121, 122, 123.

The pass elements 111, 121, 112, 122, 113, 123 may be activated to connect the respective memory cell to the common bit line BL and the complementary bit line CBL using word lines 141, 142, 143.

A data driver 150 and an inverter 160 allow for providing the voltage and current required to write data into storage elements 171, 172, 173 of the individual memory cells 101, 102, 103. A write signal line 180 and write transistors 181, 182 may be used to connect the data driver 150 and the inverter 160 to the complementary bit line CBL and the bit line BL, respectively.

Only three memory cells 101, 102, 103 are shown in FIG. 1 for simplification purposes. Typically, the number of memory cells connected to a common bit line corresponds to a power of two. For example, the number of memory cells connected to a common bit line may amount to sixteen (16) memory cells for high-speed designs and up to or more than 1024 memory cells for more area optimized memory arrays.

Moreover, only one bit line BL and its corresponding complementary bit line CBL are shown in FIG. 1. Typically, a memory array comprises several bit lines (and their complementary bit lines) with respective memory cells and the word lines 141, 142, 143 may be used to connect the respective memory cells to the respective bit lines (and complementary bit lines).

The memory array 100 is an SRAM array 100. Accordingly, the individual memory cells 101, 102, 103 are SRAM cells 101, 102, 103. The storage elements 171, 172, 173 of the SRAM cells 101, 102, 103 comprise two cross-coupled inverters. The combination of the two cross-coupled inverters may be implemented using four (4) transistors. Each SRAM cell may comprise a first pass element and a second pass element. For example, the SRAM cell 101 may comprise a first pass element 111 arranged between the storage element 171 and the common bit line BL and a second pass element 121 arranged between the storage element 171 and the complementary bit line CBL.

Figure 2:
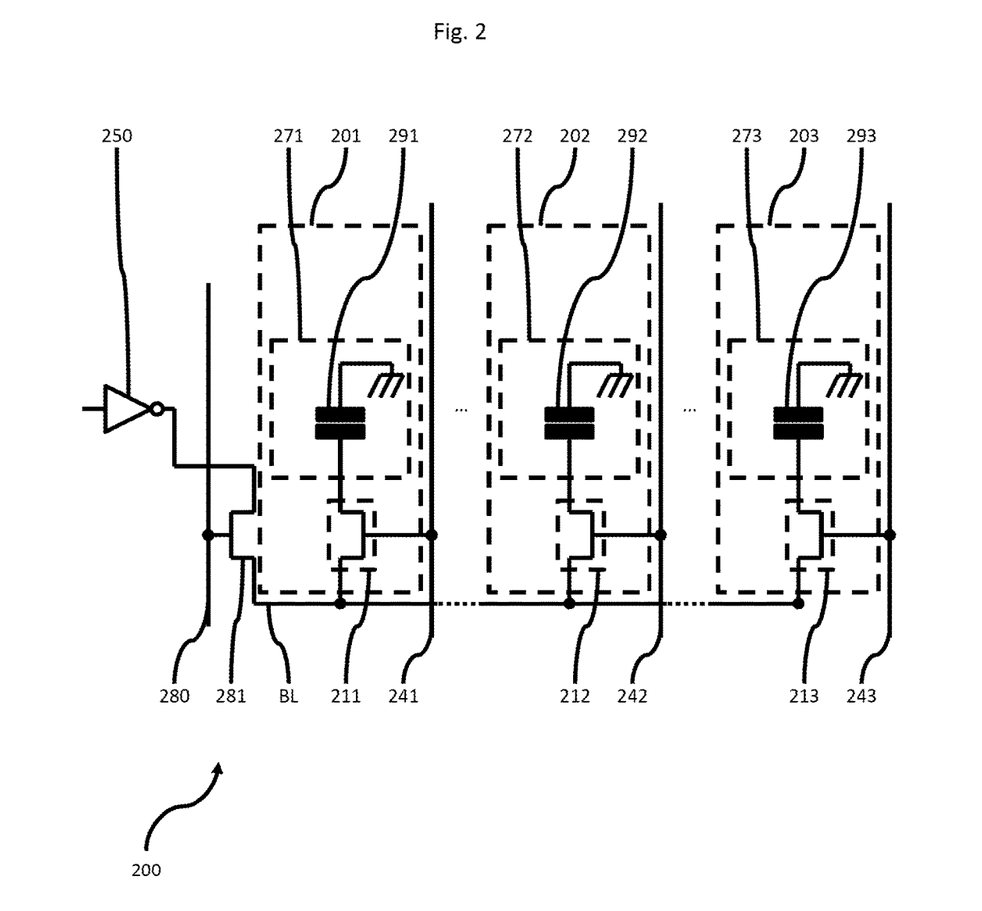
FIG. 2 shows a memory array.

FIG. 2 shows memory cells 201, 202, 203 of another exemplary memory array 200. The memory array 200 includes a common bit line BL. The individual memory cells 201, 202, 203 are coupled to the common bit line BL of the memory array 200 via respective pass elements 211, 212, 213. In particular, each individual memory cell includes a pass element for connecting the memory cell to the common bit line BL. For example, the memory cell 201 includes the pass element 211, the memory cell 202 includes the pass element 212 and the memory cell 203 includes the pass element 213.

Word lines 241, 242, 243 may be used to activate the pass elements 211, 212, 213 in order to connect the respective memory cells 201, 202, 203 to the common bit line BL.

A data driver 250 provides the voltage and current required to write data into storage elements 271, 272, 273 of the individual memory cells 201, 202, 203. A write signal line 280 and a write transistor 281 may be used to connect the data driver 250 to the bit line BL. The storage element 271, 272, 273 of the memory cells 201, 202, 203 are charge-based storage element 271, 272, 273 including a capacitance 291, 292, 293. In particular, the memory array 200 may correspond to a dynamic random access memory (DRAM) array and the memory cells 201, 202, 203 may correspond to DRAM cells.

During a read operation, the pass element of the memory cell to be read is activated to connect the memory cell to the bit line. If the memory cell stores a '1', the charge on the capacitor of the memory cell will be distributed on the bit line. The larger bit line voltage may be detected by a read sense amplifier (not shown). If the cell stores a '0', the charge on the bit line will be partially put onto the connected capacitor. Again, the reduced bit line voltage may be detected by the read sense amplifier.

During write operation, the pass element of the memory cell to be written is activated. The data driver will charge or discharge the cell capacitor. Discharging the capacitor may decrease the VSS potential near the cell below the typical VSS potential. A large voltage drop may lead to overvoltage at a transistor and may reduce lifetime and performance. Charging the capacitor may lead to an increase of the VSS potential near the memory cell above the typical VSS potential. This may translate into increased power noise. The increased power noise may have to be covered by the voltage margin for the whole chip.

Again, only three memory cells 201, 202, 203 are shown for simplification purposes in FIG. 2. Typically, the number of memory cells connected to a common bit line corresponds to a power of two. For example, the number of memory cells connected to a common bit line may amount to up to or more than 1024 memory cells for area optimized memory arrays.

Usually, a memory array comprises not only one but several bit lines with respective memory cells and the word lines 141, 142, 143 or 241, 242, 243, respectively, may be used to connect the respective memory cells to the respective bit lines.

As explained above, the pass elements of the individual memory cells of the memory array may be activated by respective word lines. The memory array may comprise 2 to the power of N ($2^N$) word lines, wherein each word line may be addressed with an address word with N bits. For example, the memory array may comprise $2^4$ word lines which may be addressed with address words 0000 to 1111, respectively.

Figure 3:
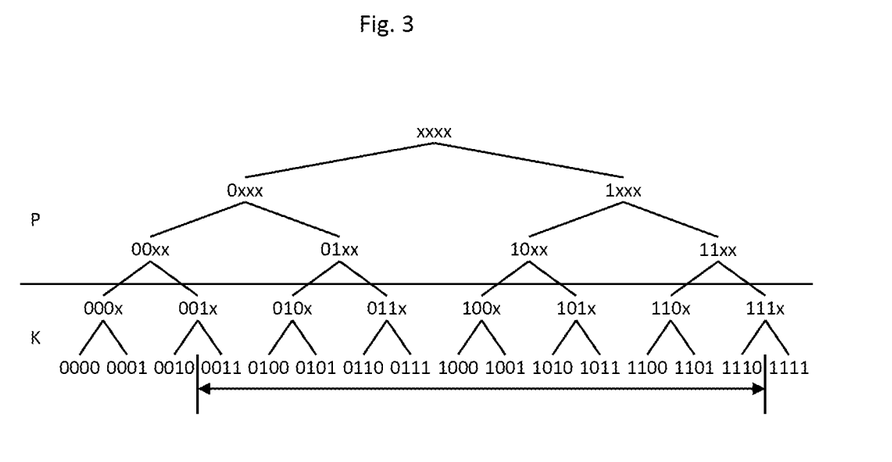
FIG. 3 shows a binary tree.

The address words may be visualized in a binary tree as shown in FIG. 3, wherein the lowest row shows the actual address words of the individual word lines. Each address word may be separated into a partition word with P bits and a remainder word with K bits. In the example of FIG. 3, the address words are separated into partition words with P=2 (two) bits and remainder words with K=2 (two) bits.

To initialize a partition corresponding to the partition word $P_1P_2$ all bits with addresses $P_1P_2$xx must be initialized. The process for initializing the partition may comprise the following steps. In a first step, the bit with address $P_1P_2$00 is connected to the bit line. In the next step, the two bits $P_1P_2$00 and $P_1P_2$10 are connected to the bit line. The already initialized bit $P_1P_2$00 helps initializing the bit $P_1P_2$10. In the next step, the four bits $P_1P_2$00, $P_1P_2$10, $P_1P_2$01, $P_1P_2$11 are connected to the bit line.

As explained above, initializing a memory block in a memory array may be performed relatively frequently in a computer system and may affect overall system performance. A memory block may refer to a large number of subsequent memory cells along parallel bit lines. Initializing may be understood as writing the same content in the respective memory cells. For example, after initialization, all initialized memory cells hold '0' or all initialized memory cells hold '1'. Typically, initializing a large number of subsequent entries in a memory array may be performed on a word line by word line basis. Hence, the number of processor cycles to perform the initialization increases linearly with the number of the to be initialized entries.

Activating all word lines of a memory array may lead to excessive current draw, which may lead to substantial power noise in the whole semiconductor circuit comprising the memory array. Hence, a higher voltage margin may have to be provided to ensure proper operation of the semiconductor circuit. This may require reducing the maximum clock frequency of the semiconductor circuit. Moreover, it may increase the power consumption of the whole circuit.

It has been found that it may be advantageous to increase the number of memory cells connected to the bit line step after step. In a first step, one or only a few memory cells are initialized. These initialized memory cells may help in the next step to initialize further memory cells. After each step, more memory cells have been initialized and can help in the subsequent step to initialize others.

For charge-based memory cells, the maximum charge that must be provided by the data driver and the VSS supply may be given by the on-voltage of a memory cell $U_{ON}$ and the capacity $Cc_{ell}$ of the capacity of the memory cell. For exemplary purposes, it may be assumed that initialization requires that the content of all memory cells has to be inverted, i.e., that all capacitors of all memory cells have to be charged, and that the memory cells are initialized starting with a single memory cell and connecting in each subsequent step a number of memory cells to the bit line corresponding to the number of memory cells already connected to the bit line.

For initializing a single memory cell in a first step i=1 a charge $$Q_1 = U_{ON} * C_{Cell}$$

may have to be provided. In a second step i=2, the initialized memory cell will help to initialize a single second memory cell. To initialize the single second memory cell, a charge $$Q_2 = 2^0 * U_{ON} * C_{Cell}$$

may have to be provided. In the next step i, the already initialized memory cells may be used to help initializing a number of memory cells corresponding to the number of already initialized memory cells. Heretofore, a charge $$Q_i = 2^{i-2} * U_{ON} * C_{Cell}$$

may have to be provided.

In the first step i=1 (one memory cell connected to the bit line), the available low resistance capacity for the charge $Q_1$ is given by the capacity $C_{bitline}$ of the bit line and the capacity of the single memory cell:

$$C_1 = 2^0 * C_{Cell} + C_{bitline}$$

In the second step i=2, the available low resistance capacity for the charge $Q_2$ is given by the capacity of the bit line $C_{bitline}$ and the capacities of the two memory cells connected to the bit line:

$$C_2 = 2^1 * C_{Cell} + C_{bitline}$$

In step i the available low resistance capacity for the charge $Q_i$ is than given by:

$$C_i = 2^{i-1} * C_{Cell} + C_{bitline}$$

Due to the low resistance, the charge in each step may be quickly distributed on the bit line and the capacitors of the memory cells connected to the bit line. Accordingly, the voltage across the capacitors of the memory cells connected to the bit line may be given in the first step i=1 by $$U_1 = \frac{Q_1}{C_1} = U_{ON} * \frac{C_{Cell}}{C_{Cell} + C_{bitline}} \approx 0$$

because $C_{bitline} \gg C_{Cell}$

In the second step i=2 the voltage across the capacitors of the memory cells connected to the bit line may be given by $$U_2 = \frac{Q_2}{C_2} = U_{ON} * \frac{C_{Cell}}{2*C_{Cell} + C_{bitline}} \approx 0$$

because $C_{bitline} \gg C_{Cell}$

In step i the voltage across the capacitors of the memory cells connected to the bit line may than be given by $$U_i = \frac{Q_i}{C_i} = 2^{i-2} * U_{ON} * C_{Cell} / (2^{i-1} * C_{Cell} + C_{bitline})$$

For large i, the term $2^{i-1} * C_{Cell}$ becomes considerably greater than $C_{bitline}$ resulting in $$\lim_{i \to \infty} U_i = 2^{-1} * U_{ON}$$

The immediate reduction of the voltage to the half of the voltage of the nominal capacitor voltage due to the other capacitors already connected to the bit line may reduce the local current draw dramatically, and local current hot spots may be avoided. This may reduce power noise and voltage margins of the semiconductor circuit may be decreased.

The new memory cells to be initialized in each iteration step may be more or less evenly distributed along the bit line. Moreover, only a part of the memory cells to be initialized will have to be inverted typically. However, in the last iteration steps several memory cells having to be inverted may be close to each other. This may result in higher local current upon initialization. Hence, the number of memory cells to be initialized may increase less in the last iterations. For example, the number of activated word lines could follow a binary power series in the first iterations and increase linearly in the last iterations.

Figure 4:
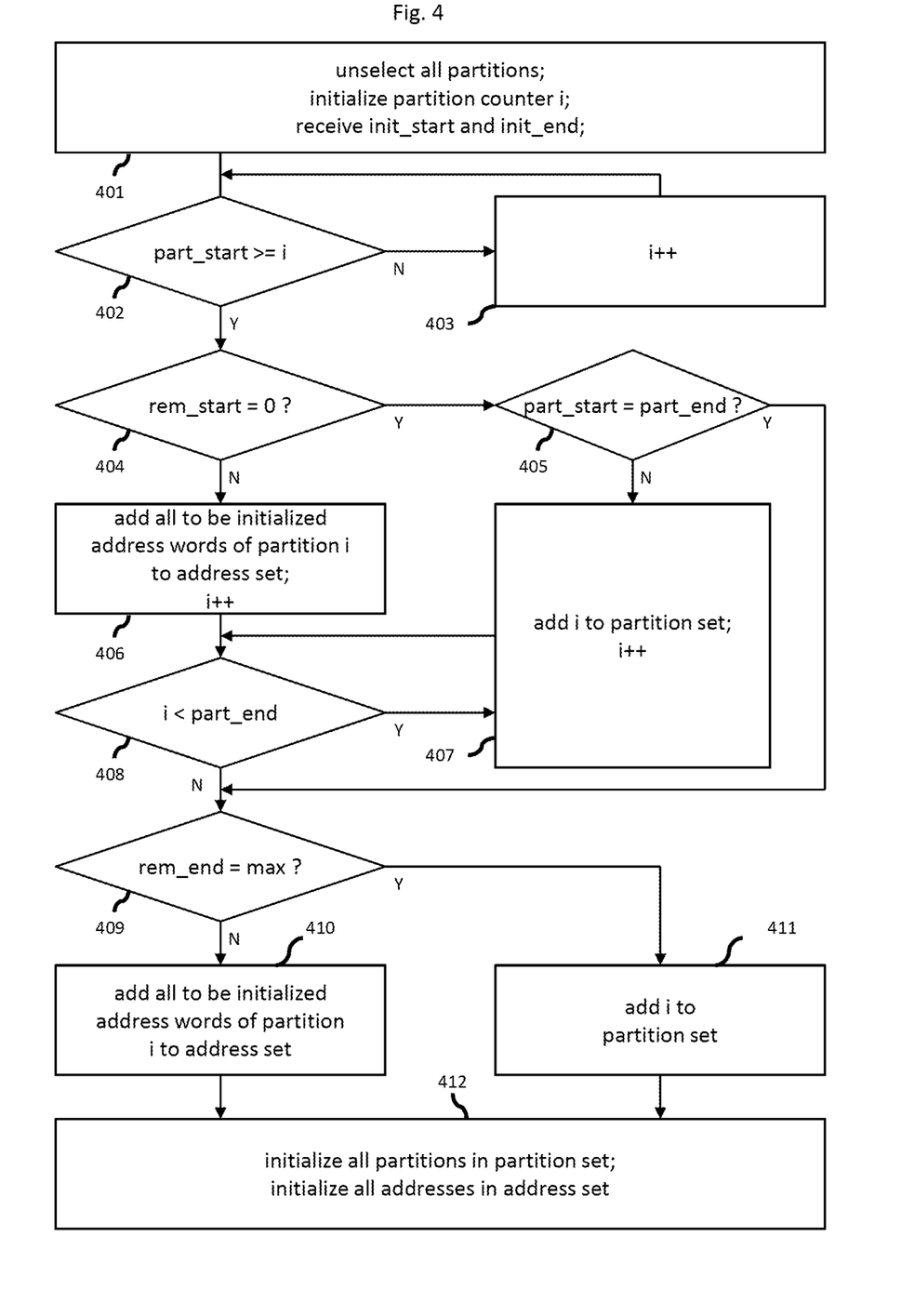
FIG. 4 illustrates a method for initializing memory cells.

FIG. 4 illustrates a method for initializing memory cells of a memory array, e.g., of a memory according to FIG. 1 or 2. A first entry of the memory block to be initialized may have the address word init_start and the last entry of the memory block to be initialized may have the address word init_end.

As example, reference is made to FIG. 3. The memory block to be initialized may start at the address word 0011 and end at the address word 1110. Thus, initializing requires initializing a part of the memory partition 00xx, the complete memory partition 01xx, the complete memory partition 10xx and a part of the memory partition 11xx.

In step 401, all partitions are unselected, a partition counter i is initialized (i.e., i=0) and the address words init_start and init_end are received. The address word init_start consists of the partition word part_start and the remainder word rem_start. Accordingly, the address word init_end consists of the partition word part_end and the remainder word rem_end.

Step 402 describes comparing the partition word part_start with the partition counter i. If the partition word part_start is greater or equal than the partition counter i (i.e., part_start>=i), the method proceeds with step 404, otherwise with step 403. In the first iteration, it is determined in step 402 whether the address word from which the initialization of the memory block is to be started belongs to the first partition (i.e., partition counter=0) of the memory array. If this is not the case, the partition counter i is increased (i.e., i++) in step 403 and step 402 is repeated with the new value of the partition counter, i.e., it is determined if the address word from which the initialization of the memory block is to be started belongs to the second partition, etc.

In the example of FIG. 3, the memory block to be initialized starts at the address word 0011 and the partition word part_start is 00. As i has been initialized (i.e., i=0) and 00 is greater or equal than i=0 the method continues with step 404.

In step 404 it is determined whether the remainder word rem_start of the address word init_start is zero (rem_start=0). Thus, it is determined whether the initialization starts at the beginning of the partition i. If this is the case, it is determined whether the partition word part_start of the address word init_start indicating the start of the memory block to be initialized is identical to the partition word part_end of the address word init_end indicating the end of the memory block to be initialized in step 405. If this is the case, it is determined if the remainder word rem_end of the address word init_end indicating the end of the memory block to be initialized is max, i.e., if all bits of the remainder word are 1 in step 409. If this is the case, the current value of the partition count i is entered into the partition set in step 411. If not, all to be initialized address words of the partition i are selected to be included in an address set (step 410).

If it is determined in step 405 that the partition word part_start is different from the partition word part_end, the method continues with step 407 as will be explained further below.

In case it is determined in step 404 that the remainder word rem_start is not zero, i.e. the initialization is to begin in the middle of a partition, the method continues with step 406 which prescribes adding all to be initialized address words of the current partition i into the address set and increments the partition counter (i.e., i++).

With respect to the example of FIG. 3, the remainder word rem_start is 11 and therefore different from 00. Accordingly, the method continues with step 406 and the address word 0011 is entered in the address set and the partition count is incremented from 00 to 01.

After step 406, it is determined whether the current value of the partition counter is less than the partition word part_end (i.e., i<part_end) of the address word indicating the last entry of the memory block to be initialized (step 408). If this is the case, the current value of the partition counter i is selected into the partition set (i.e., add i to partition set), the current partition counter i is incremented (i.e., i++) and step 408 is repeated with the new value of the partition counter. Otherwise, the method continues with step 409 which has already been explained above.

Continuing with the example of FIG. 3, the partition counter i has the value 01 after step 406 as explained above and the partition word of address word init_end 1110 is 11. Thus, it is determined that 01 is less than 11 in a first iteration of step 408, the partition counter value 01 is added to the partition set and partition count is incremented to 10 in a first iteration of step 407. In a second iteration of step 408, it is determined that 10 is still less than 11 implying that the partition word 10 is entered in the partition set and the partition counter is incremented to 11 in a second iteration of step 407. In a third iteration of step 408, it is determined that 11 is not less than 11 and the method continues with step 409. Thus, after the multiple iteration of step 407, the partition set comprises the partitions 01, 10.

Further continuing with the example of FIG. 3, it is determined that the remainder word rem_end 10 of the address word init_end 1110 indicating the end of the memory block to be initialized is not at its max, which would be 11. Thus, the to be initialized address words 1100, 1101, 1110 of the partition 11 are added to the address set.

Thus, for the example of FIG. 3 the method results in a partition set containing 01 and 10 and an address set containing 0011, 1100, 1101 and 1110.

In the last step 412 of the method according to FIG. 4 the partitions in the partition set and the addresses in the address set are initialized. Theretofore, an initializing circuit according to FIG. 5 may be used.

Figure 5:
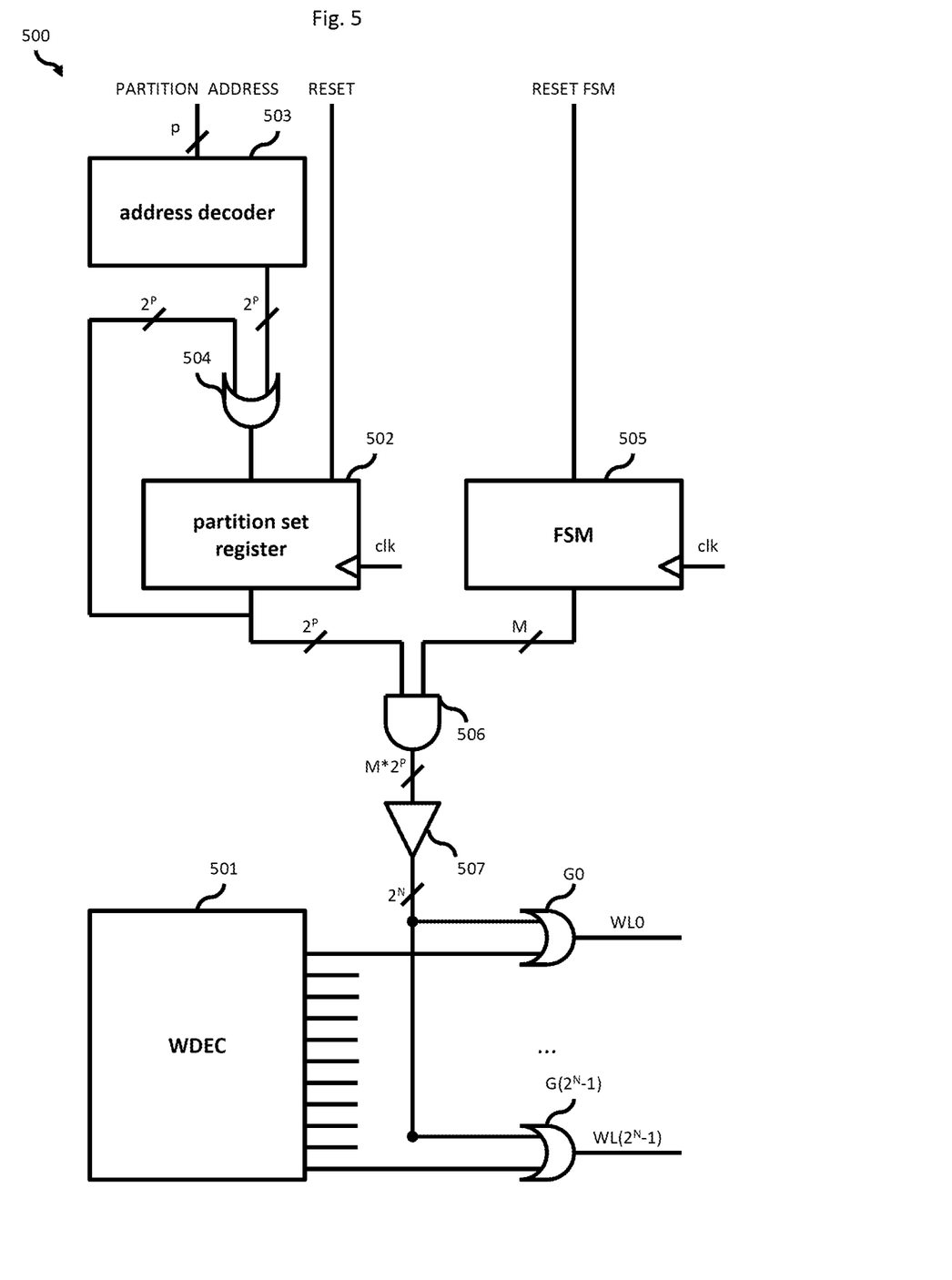
FIG. 5 shows an initialization circuit.

FIG. 5 shows an exemplary initialization circuit 500 for initializing memory cells of a memory array. The initialization circuit 500 may be used for initializing memory cells of one of the memory arrays 100 or 200 shown in FIGS. 1 and 2, respectively.

The initialization circuit 500 may be used for initializing memory cells of a memory array comprising $2^N$ word lines WL0 to WL($2^N-1$). The second inputs of the OR-gates G0 to G($2^N-1$) may be used for initializing memory cells of the memory array. Each word line may be addressed with an address word with N bits, wherein each address word may be separated into a partition word with P bits and a remainder word with K bits. The initialization circuit 500 comprises a word decoder (WDEC) 501 which addresses the word lines WL0 to WL($2^N-1$) during normal reading and writing operations. Heretofore, the outputs of the word decoder (WDEC) 501 are connected to respective first inputs of OR-gates G0 to G($2^N-1$). The outputs of the OR-gates G0 to G($2^N-1$) are connected to the word lines WL0 to WL($2^N-1$).

The second inputs of the OR-gates G0 to G($2^N-1$) may be used for initializing memory cells of the memory array. In particular, the second inputs of the OR-gates G0 to G($2^N-1$) may be used to activate the pass elements of the memory cells connected to the word lines WL0 to WL($2^N-1$) so that the memory cells are connected to the respective bit lines. The data value to be written into the memory cells to be initialized may be provided by a data driver which is not shown in FIG. 5. The data value may be selected such that all initialized cells hold '0' or all initialized cells hold '1' after initialization.

The initialization circuit 500 may be particularly useful to initialize one or more partitions of the memory array in parallel. A partition may correspond to a number of subsequent memory cells sharing the same partition word. A set of partition addresses may specify the partitions, the memory cells of which are to be initialized. A partition address may correspond to a partition word.

A set of partition addresses specifying the partitions, the memory cells of which are to be initialized, may be temporarily stored in a partition set register 502. As explained hereinbefore, the partition word has a length of P bits. Hence, the memory array comprises $2^P$ different partitions. For each of the $2^P$ different partitions the partition set register 502 may store the information whether the respective partition is to be initialized or not. Hence, the partition set register 502 may comprise $2^P$ entries. Referring to the example of FIG. 3, the address word may have a length of N=4 bits and the partition word may have a length of P=2 bits. For each of the four (4) partitions (namely, 00xx, 01xx, 10xx, 11xx), the partition set register 502 may comprise an entry indicating whether the partition is to be initialized or not. An entry '1' may indicate that the respective partition is to be initialized and an entry '0' may indicate that the respective partition is not to be initialized.

The partition set register 502 may be reset such that all entries read '0' by transmitting a signal RESET=1 to the respective input of the partition set register 502. In the example of four partitions, the entries of the partition set register 502 may read '0000'.

The initialization circuit 500 may receive a set of partition addresses via an input PARTITION ADDRESS. The input may have a width of P bits corresponding to the width of the partition word.

An address decoder 503 may have an output having a width corresponding to the number of entries of the partition set register 502. The address decoder 503 may also be called a partition address decoder. The partition address decoder may decode a partition address into a partition code. The partition code may be a one-hot code comprising a single active bit for selecting a single partition. The partition address decoder may input a partition address mask and decode the partition address and the partition address mask into a partition code comprising multiple active bits. In particular, the address decoder 503 may have an output of a width of $2^P$. The address decoder 503 may receive the partition address and may write a '1' into the respective entry of the partition set register 502. For example, the address decoder 503 may receive a partition word '01' and may transmit the signal 0100 to the partition set register 502 via the OR-gate 504 indicating that the complete partition 01xx is to be initialized. The partition set register may also be called partition code register. The partition code register may accumulate the received partition codes.

The partition set register 502 may transmit the stored values via an output having a width of $2^P$ width. For example, the partition set register 502 may transmit the signal 0100 after the first cycle.

In a next cycle, the address decoder 503 may receive a different partition address indicative of a second partition to be initialized and write a '1' into the respective entry of the partition set register 502. The loop from the output of the partition set register 502 to one of the inputs of the OR-gate 504 ensures that the previously written entry or entries are maintained in the partition set register 502. For example, the second partition address may read '10'. Hence, the address decoder 503 may transmit the signal '0010'. Due to the loop and the OR-gate 504 and the loop, the partition set register 502 receives the signal '0110' indicating that the two partitions 01xx and 10xx are to be initialized.

For each partition of the memory array a number of M word line sets WS0 to WS(M−1) may be specified. For each partition, each word line set WS0 to WS(M−1) may define a number of word lines which are (additionally) to be activated in a (first) next iteration of the initialization of the partition to be initialized.

The counter 505 may be used for sequentially activating the word line sets WS0 to WS(M−1). In particular, the counter 505 may transmit a signal indicating the word line sets which are to be activated. The last digit of the signal may indicate whether the word line set WS0 is to be activated, the penultimate digit of the signal may indicate whether the word line set WS1 is to be activated, etc. Finally, the first digit of the signal may indicate whether the word line set WS(M−1) is to be activated.

The AND-gate 506 receives the signals from the partition set register 502 and the counter 505 and transmits a signal to the word line set decoder 507 indicating which word line sets of which partitions are to be activated for initializing.

The counter 505 may be a finite state machine (FSM) comprising a thermometer counter. While receiving the partition addresses specifying the partitions to be initialized, an input RESET FSM of a counter 505 may receive a signal reset fsm='1' and transmit a signal comprising (M−1) '0's (zeros) followed by a single '1' (one).

Accordingly, with every new partition address entered into the partition set register 502 the corresponding word line set WS0 is activated. Thus, the word line sets WS0 of the partitions to be initialized are activated sequentially.

Once, all partitions sets have been entered in the partition set register 502, the counter 505 may receive a signal reset fsm='0' and may start transmitting a thermometer code. In a first clock cycle after starting the counter 505, the counter 505 may transmit a signal 00 . . . 011 indicating that the first and the second word line sets WS0 and WS1 are to be activated. The memory cells of the first word line sets WS0 of the partitions to be initialized already having been initialized during entering the partitions in the partition set register 502 will help initializing the memory cells of the second word line sets WS1 of the partitions to be initialized. Thus, all word line sets WS1 of the partitions to be initialized may be activated in parallel. Each time the counter 505 is incremented an additional digit is given the value of 1 until the counter 505 finally transmits a signal 11 . . . 111 indicating that all word line sets WS0 to WS(M−1) are to be activated.

Word line set decoder 507 may receive the signal from the AND-gate 506 and activate the word lines of the word line sets of the partitions to be initialized. For each partition, the number of activated word lines increases with activated word line sets. The total number of activated word lines per partition may double with each additionally activated word line set. For example, activating a first word line set WS0 may activate one ($2^0$) single word line, additionally activating a second word line set WS1 may activate an additional word line resulting in two ($2^1$) activated word lines, additionally activating a third word line set WS2 may activate additional two word lines resulting in four ($2^2$) activated word lines, etc. Thus, the total number of activated word lines per partition may follow a binary power series. All memory cells connected to a bit line may have equal drive strengths. Using a binary power series for activating the word lines may reduce in a low total latency for the initialization procedure. In case a binary power series is used the number of word line sets M may correspond to one plus the number K of bits of the remainder word (i.e., M=K+1). In the example of FIG. 3, a first word line set WS0 may consist of the single word line xx00, a second word line set WS1 may consist of the word line xx10, a third word line set WS2 may consist of the word lines xx01, xx11.

Memory cells connected to a common bit line may also have different drive strengths. In particular, there may be weak memory cells, i.e. memory cells having a low drive strength, and strong memory cells, i.e. memory cells having a high drive strength. In late iteration steps, i.e. when many word line sets are activated and many memory cells are connected to the common bit line, the mismatch may be badly distributed. In particular, many memory cells in the '0' state may be weak and many memory cells in the '1' state may be strong. Providing for a lower number of additionally activated word lines than prescribed by the above-described binary power series in late iteration steps may avoid having to provide very strong data drivers for initializing the memory cells in late iteration steps. For example, the number of additionally activated word lines could remain constant in late iteration steps.

If the memory cells connected to the common bit line (i.e., the activated word lines) are distributed evenly over the common bit line, the effective resistance between the memory cells may be smaller than in a case where all initialized memory cells are adjacent to each other.

The initialization circuit 500 of FIG. 5 may be used to initialize a large memory block in a memory array in a short amount of time. The partitions to be initialized completely may be determined using the method described with respect to FIG. 4 and the respective partitions addresses may be transmitted to the address decoder 503. The remaining entries of the memory block to be initialized and stored in the address set according to the method described with respect to FIG. 4 may be initialized one-by-one using the word decoder 501.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. Initialization circuit for initializing memory cells of a memory array, comprising:
   a common bit line, wherein the individual memory cells are coupled to the common bit line of the memory array via at least one pass element of the individual memory cells, and wherein the initialization circuit:
   receives a set of partition addresses, wherein the set of partition addresses specifies the partitions, the memory cells of which are to be initialized;
   successively initializes one cell of the partitions to be initialized; and
   iteratively initializes remaining memory cells of the partitions to be initialized, wherein a number of memory cells initialized simultaneously in one iteration increases from one iteration to another iteration;
   initializes a certain memory cell comprising activating the pass element of that memory cell so that the memory cell is connected to the bit line and wherein the initialization circuit comprises:
   a partition address decoder, wherein the partition address decoder decodes a partition address into a partition code;

a partition code register, wherein the partition code register receives the partition code from the partition address decoder and the partition code register accumulates a received partition codes; and a gate, wherein the gate calculates a bitwise logical OR of the partition code and a momentary accumulated partition code stored in the partition code register.

2. Initialization circuit of claim 1, wherein the remaining memory cells are iteratively initialized in parallel for the partitions to be initialized.

3. Initialization circuit of claim 1,
wherein the partition code is a one-hot code comprising a single active bit for selecting a single partition.

4. Initialization circuit of claim 1,
wherein the partition address decoder inputs a partition address mask, and decodes the partition address and the partition address mask into the partition code comprising multiple active bits, thereby selecting multiple partitions.

5. Initialization circuit of claim 1,
wherein the circuit comprises an initialization sequencing finite state machine (FSM) and combinational logic, the combinational logic being operable for determining binary control signals for activating at least one pass element of the individual memory cells based on a content of the partition code register and a state of the initialization sequencing FSM.

6. Initialization circuit of claim 1, wherein the partitions are equally sized, the size corresponding to a power of two.

7. Initialization circuit of claim 1,
wherein the memory array includes a complementary bit line,
wherein the memory array is an SRAM array,
wherein the individual memory cells are SRAM cells,
wherein the individual SRAM cells each comprise
a storage element,
a first pass element and a second pass element,
wherein the first pass element is arranged between the storage element and the common bit line,
wherein the second pass element is arranged between the storage element and the complementary bit line.

8. Method for initializing memory cells of a memory array comprising:
providing a set of partition addresses, wherein the set of partition addresses specifies one or more partition, memory cells of which are to be initialized;
successively initializing one cell of the partitions to be initialized;
iteratively initializing remaining memory cells of the partitions to be initialized, wherein a number of memory cells initialized simultaneously in one iteration increases from one iteration to another iteration and initializing a certain memory cell comprises activating a pass element of that cell so that the memory cell is connected to a bit line, and wherein iteratively initializing the remaining memory cells is performed in parallel for the partitions to be initialized, and
wherein the initializing further comprises:
decoding a partition address into a partition code;
accumulating the decoded partition codes in a partition code register; and
calculating, by a gate, a bitwise logical OR of the partition code and a momentary accumulated partition code stored in the partition code register.

9. Method for initializing memory cells of a memory array according to claim 8, wherein iteratively initializing the remaining cells is performed in parallel for the partitions to be initialized.

10. Method for initializing memory cells of a memory array according to claim 8,
wherein a partition code is a one-hot code comprising a single active bit for selecting a single partition.

11. Method for initializing memory cells of a memory array according to claim 8 further comprising:
inputting a partition address mask; and
decoding a partition address of one of the set of partition addresses and the partition address mask into a partition code comprising multiple active bits, thereby selecting multiple partitions.

12. Method according to claim 11 comprising:
receiving an address word init_start indicative of a first address of a memory block to be initialized;
receiving an address word init_end indicative of a last address of a memory block to be initialized,
wherein providing a set of partition addresses comprises determining the partition addresses based on the address words init_start and init_end;
determining address words of memory cells to be initialized which are not included in the partitions to be initialized based on the address words init_start and init_end; and
initializing the memory cells to be initialized which are not included in the partitions.

13. Method according to claim 12, wherein the initializing the memory cells to be initialized which are not included in the partitions includes initializing the memory cells one-by-one.

14. Method according to claim 13, wherein the initializing the memory cells to be initialized which are not included in the partitions includes initializing the memory cells after initializing the partitions or in parallel with initializing the partitions.

15. Method according to claim 8, further comprising:
determining binary control signals for activating at least one pass element of the individual memory cells based on the content of a partition code register and a state of an initialization sequencing finite state machine (FSM).

* * * * *